US010067191B2

(12) United States Patent
Butzmann

(10) Patent No.: US 10,067,191 B2
(45) Date of Patent: Sep. 4, 2018

(54) LITHIUM-ION ENERGY STORE AND METHOD FOR DETECTING A DEPTH OF DISCHARGE AND/OR A STATE OF CHARGE OF A LITHIUM-ION ENERGY STORE

(71) Applicant: Robert Bosch GmbH, Stuttgart (DE)

(72) Inventor: Stefan Butzmann, Schalksmühle (DE)

(73) Assignee: Robert Bosch GmbH, Stuttgart (DE)

( * ) Notice: Subject to any disclaimer, the term of this patent is extended or adjusted under 35 U.S.C. 154(b) by 17 days.

(21) Appl. No.: 15/028,893

(22) PCT Filed: Sep. 30, 2014

(86) PCT No.: PCT/EP2014/070844
§ 371 (c)(1),
(2) Date: Apr. 12, 2016

(87) PCT Pub. No.: WO2015/055414
PCT Pub. Date: Apr. 23, 2015

(65) Prior Publication Data
US 2016/0252580 A1    Sep. 1, 2016

(30) Foreign Application Priority Data

Oct. 14, 2013  (DE) ........................ 10 2013 220 711

(51) Int. Cl.
*G01R 31/36*    (2006.01)
*H01M 10/48*    (2006.01)
(Continued)

(52) U.S. Cl.
CPC ..... *G01R 31/3606* (2013.01); *G01R 31/3665* (2013.01); *G01R 31/3696* (2013.01);
(Continued)

(58) Field of Classification Search
CPC ............................................... G01R 31/3606
(Continued)

(56) References Cited

U.S. PATENT DOCUMENTS 4,295,097 A * 10/1981 Thompson ........... G01R 31/361
324/426
2004/0128089 A1* 7/2004 Barsoukov ......... G01R 31/3662
702/65
(Continued)

FOREIGN PATENT DOCUMENTS

CN    1298106 A    6/2001
CN    101169471 A    4/2008
(Continued)

OTHER PUBLICATIONS

International Search Report for Application No. PCT/EP2014/070844 dated Apr. 14, 2015 (English Translation, 3 pages).

*Primary Examiner* — Samuel Berhanu
*Assistant Examiner* — Tessema Kebede
(74) *Attorney, Agent, or Firm* — Michael Best & Friedrich LLP

(57) ABSTRACT

The invention relates to a lithium-ion energy store (1), comprising an electrode (2, 3) having a main segment (2) and having a measurement segment (3) electrically isolated from the main segment (2), a counter-electrode (4), and a separator (5) between the electrode (2, 3) and the counter-electrode (4), wherein a measuring cell (3, 4), which forms part of the lithium-ion energy store (1), comprises the measuring segment (3) of the electrode (2, 3), a counter-electrode measuring segment, which is opposite the measuring segment (3) of the electrode (2, 3) with respect to the separator (5), and a segment of the separator (5) in arranged between the measuring segment (3) of the electrode (2, 3) and the counter-electrode measuring segment, and a main cell (2, 4), which forms part of the lithium-ion energy store (1), comprises the main segment (2) of the electrode (2, 3), a counter-electrode in main segment, which is opposite the main segment (2) of the electrode (2, 3) with respect to the separator (5), and a segment of the separator (5) arranged
(Continued)

between the main segment (2) of the electrode (2, 3) and the counter-electrode main segment, wherein the lithium-ion energy store (1) has a measuring device (110) for a depth of discharge and/or a state of charge of the measuring cell (3, 4).

9 Claims, 2 Drawing Sheets

(51) Int. Cl.
*H02J 7/00* (2006.01)
*H01M 10/052* (2010.01)
*H01M 10/42* (2006.01)
*H01M 4/02* (2006.01)

(52) U.S. Cl.
CPC ......... *H01M 10/052* (2013.01); *H01M 10/48* (2013.01); *H02J 7/0047* (2013.01); *G01R 31/362* (2013.01); *H01M 10/425* (2013.01); *H01M 2004/025* (2013.01); *H02J 2007/005* (2013.01); *Y02T 10/7011* (2013.01)

(58) Field of Classification Search
USPC ......................................................... 324/426
See application file for complete search history.

(56) References Cited

U.S. PATENT DOCUMENTS

| | | | |
|---|---|---|---|
| 2005/0017685 A1* | 1/2005 | Rees | G01R 31/3679 320/132 |
| 2008/0094029 A1* | 4/2008 | Singh | H01M 10/441 320/118 |
| 2009/0104510 A1 | 4/2009 | Fulop et al. | |
| 2010/0285349 A1* | 11/2010 | Goto | H01M 10/0525 429/156 |
| 2012/0263986 A1 | 10/2012 | Fulop et al. | |
| 2013/0295424 A1* | 11/2013 | Knoedgen | H01M 10/484 429/91 |
| 2013/0323542 A1* | 12/2013 | Wijayawardhana | H01M 4/00 429/50 |

FOREIGN PATENT DOCUMENTS

| | | |
|---|---|---|
| DE | 102012018126 | 3/2014 |
| EP | 1918728 | 5/2008 |
| EP | 2442400 | 4/2012 |
| FR | 2986867 | 8/2013 |
| WO | 2013006415 | 1/2013 |
| WO | 2014041074 | 3/2014 |

* cited by examiner

LITHIUM-ION ENERGY STORE AND METHOD FOR DETECTING A DEPTH OF DISCHARGE AND/OR A STATE OF CHARGE OF A LITHIUM-ION ENERGY STORE

BACKGROUND OF THE INVENTION

This invention relates to a lithium ion energy storage device and a method for ascertaining a depth of discharge and/or a state of charge of a lithium ion energy storage device in accordance with the invention.

Lithium ion energy storage devices have a high cell voltage and a good ratio between stored energy and weight and are therefore suitable for mobile applications, in particular for electrically operated vehicles. Lithium ion energy storage devices are frequently produced in a wound construction, wherein a planar material is wound up, said planar material comprising two planar electrodes and a separator that separates the electrodes electrically from one another. The electrodes typically comprise a metal collector that is coated preferably on both sides with an electrode material. Typically, aluminum foil is used as the metal collector in the cathode electrode and copper foil is used as the metal collector in the anode electrode. Usually, the separator is saturated between the electrodes with an ion-transporting means that renders it possible for the ions to pass through the separator.

It is known to measure the current that is output by a lithium ion energy storage device using a plurality of different sensors, by way of example sensors having a shunt resistor or having Hall sensors. In addition to measuring means for the direct current flow, a plurality of other sensors and/or theoretical models do exist that can be used to ascertain the characteristics of lithium ion energy storage devices. For this purpose, sensors are typically used to ascertain a number of specific characteristics of the energy storage device and the theoretical models are applied to the ascertained values in order to infer the electrical characteristics and/or the state of the energy storage device.

EP 2442400 A1 discloses an electrochemical cell on the basis of lithium technology having an inner-lying reference electrode. This is embedded in the separator so that a reference cell is formed between the reference electrode and each of the conventional electrodes of the cell. By virtue of determining characteristics of the two reference cells that represent half cells of the energy storage device, information can be obtained regarding each of these half cells and consequently also regarding the entire energy storage device. In so doing, either the current of the entire cell is measured or a state of the energy storage device is inferred by way of other parameters and theoretical models. The additional electrode that is introduced into the separator prevents the flow of ions at this site and is encumbered with the risk of a short circuit of the electrodes.

SUMMARY OF THE INVENTION

In accordance with the invention, it is proposed to provide the lithium ion energy storage device with a measuring cell, a main cell and a measuring procedure with which the depth of discharge and/or the state of charge of the measuring cell can be ascertained.

In the case of the lithium ion energy storage device in accordance with the invention, at least one of anode and cathode is divided into a main section and a measuring section that are electrically separate from one another, as a consequence of which a measuring cell and a main cell of the energy storage device are produced. The measuring cell comprises the measuring section of the electrode, a mating electrode measuring section that lies opposite the measuring section of the electrode in relation to the separator and a section of the separator that is located between the measuring section of the electrode and the mating electrode measuring section. The main cell comprises the mating electrode main section of the electrode and in a similar manner to the measuring cell a mating electrode main section that lies opposite the main section of the electrode in relation to the separator and a section of the separator that is located between the mating electrode main section of the electrode and the main section of the mating electrode. An electrode of the energy storage device comprises the main section and the measuring section. Typically, the measuring section is considerably smaller that the main section. A mating electrode lies opposite the electrode in relation to the separator and can be effective both for the main section and the measuring section. A part of the mating electrode that is described as the mating electrode measuring section lies opposite the measuring electrode, whereas a part of the mating electrode that is described as the mating electrode main section lies opposite the main electrode. It is possible to use both the anode and also the cathode as an electrode, whilst correspondingly the cathode or the anode is used as the mating electrode. The separator can be provided as a single, coherent element both for the measuring cell and also for the main cell. However, it is feasible also to divide the separator or/and the mating electrode so that sections are produced that are allocated in each case to the main section of the electrode or the measuring section of the electrode.

The main power output of the lithium ion energy storage device is produced by the main cell. The main cell is usually considerably larger than the measuring cell both with respect to the storage capacity of the energy storage device and also with regard to the share of surface area of the electrode or the mating electrode. By way of example, the capacity of the main cell is at least ten times the capacity of the measuring cell. Accordingly, the characteristics of the measuring cell that are related to the surface area, such as for example the ability to output current, an energy content and the like, can be transferred from the measuring cell to the main cell, in that a factor of the surface area ratio of the two cells is used for the scaling procedure. Characteristics of the lithium ion energy storage device that are not related to the surface area, such as a depth of discharge, a state of charge or a state of aging can be transferred to the main cell on the basis of a measurement taken at the measuring cell, in particular if it is to be assumed that the at least almost identical conditions prevail at the measuring cell and the main cell.

The lithium ion energy storage device in accordance with the invention having a measuring device for ascertaining the depth of discharge and/or the state of charge of the measuring cell has the advantage that the measuring cell can be charged or discharged for this ascertaining procedure without the main cell having to be charged or discharged. Under certain circumstances, the main cell can be operated independently from ascertaining the depth of discharge and/or the state of charge of the measuring cell. It is preferred that the depth of discharge and/or the state of charge of the measuring cell and the main cell are identical or at least similar at the commencement of the procedure of measuring the depth of discharge and/or the state of charge of the measuring cell. It is possible to regard as a definition for the terms 'depth of discharge' and/or 'state of charge' the level of charge of the lithium ion energy storage device in relation to two reference states, of which one is a state of maximum charge in the lithium ion energy storage device and the other is a state of minimum charge in the lithium ion energy storage device.

In one embodiment of the lithium ion energy storage device, the measuring device comprises a current source with which the measuring cell can be charged or discharged. The current source is connected for this purpose to the measuring section of the electrode and the mating electrode, in particular to the mating electrode measuring section. In addition, the lithium ion energy storage device comprises a voltage ascertaining device that can be used to ascertain the voltage of the measuring cell. The voltage ascertaining device is connected for this purpose to the measuring section of the electrode. The term 'ascertaining' can mean in this case measuring a voltage but the comparison with a reference voltage. In addition, the lithium ion energy storage device comprises a time measuring device that is preferably designed so as to measure a period of time from the commencement of the charging procedure or the commencement of the discharging procedure until a predefined voltage has been achieved in the measuring cell. It is preferred that the time measuring device reacts to a signal that represents the point in time at which the charging procedure or discharging procedure commences and reacts preferably to a signal that indicates a predefined voltage has been achieved in the measuring cell.

In a further embodiment of the lithium ion energy storage device, the voltage ascertaining device is embodied as a comparator. It is preferred that the comparator is an analog comparator having a positive input and a negative input, wherein the comparator generates an output signal that indicates which of the two voltages that are applied to the positive input or negative input is greater. One input of the comparator is connected to the measuring section of the electrode. The other input is preferably connected to a reference voltage source. The reference potential of the voltage at the measuring section and at the reference voltage source is preferably in each case the mating electrode of the lithium ion energy storage device. In particular, the output signal of the comparator is used so as to cause the time measuring device to terminate the time measuring procedure. In addition, the procedure of charging or discharging the measuring cell can be terminated on the basis of the output signal of the comparator, in that by way of example the current source is switched off, as a consequence of which a charging current or discharging current no longer flows.

In a further embodiment of the lithium ion energy storage device, the measuring device comprises a reference voltage source that is connected to the comparator. It is preferred that the reference voltage source supplies a reference voltage of 2.8 V, which is preferably used to define the end of a discharging procedure, or a reference voltage of 4.2 V, wherein a charging procedure can be terminated upon achieving the reference voltage of 4.2 V. Other reference voltages are likewise conceivable. The reference voltage source is preferably connected between an input of a comparator and the mating electrode.

In a further embodiment of the lithium ion energy storage device, the time measuring device operates in a pulsed manner. The pulse can supply a counter that can count the pulse cycles as a measurement for the elapsed time. It is preferred that the time measuring device is a microcontroller or a part thereof. The start signal for the time measuring device is preferably generated by the comparator. As an alternative to an analog comparator, it is also possible to provide a digital comparator. By way of example, the voltages can be measured at the inputs using analog-digital converters, the input voltages can be compared in a digital manner and a corresponding output signal generated. Such a digital comparator can be part of the microcontroller. The microcontroller preferably comprises an output with which the current source can be switched on or off, wherein it is preferred that this output reacts to an output signal of the comparator.

In a further embodiment of the lithium ion energy storage device, the current source is designed so as to output a constant current. A constant current leads to a particularly simple calculation of the magnitude of the charge flow and consequently also of the state of charge or the depth of discharge of the measuring cell. The microcontroller can be connected to a control input of the current source, so that the microcontroller can switch on or switch off the current source. It is preferred that the comparator, the time measuring device and a control unit for switching on or switching off the current source are combined in the microcontroller.

In a further aspect of the invention, a method is proposed that is used to ascertain the depth of discharge and/or state of charge of a lithium ion energy storage device in accordance with one of the previously described embodiments. In the method, the flow of a charging current or discharging current into or out of the measuring cell is commenced, wherein the start time simultaneously starts the time measuring procedure. The procedure of charging or discharging the measuring cell leads to a change in the voltage of the measuring cell. In accordance with the method, the time measuring procedure is terminated if the voltage across the measuring cell achieves a predefined voltage. It is preferred that during the charging procedure the reference voltage is the voltage of the measuring cell at the start time. It is likewise preferred that the reference voltage during the discharging procedure is lower than the voltage of the measuring cell at the start time. The reference voltage is preferably generated by the reference voltage source. The measured charging period or discharging period is the period of time between the start time of the charging procedure or discharging procedure and the point in time at which the reference voltage is achieved. This period of time represents how much charge has flown into the measuring cell or how much charge has been withdrawn from the measuring cell. The magnitude of this charge represents in turn where to classify the state of charge of the measuring cell at the start time in relation to a maximum or minimum state of charge of the measuring cell. Similarly to such a charge state at the start time, it is possible to define a depth of discharge of the measuring cell. This does not relate to how full the energy storage device is but rather how empty it is.

In one embodiment of the method, the time measuring procedure is carried out by means of the time measuring device. In a further embodiment of the method, the depth of discharge and/or the state of charge of the main cell, in particular at the start time, is inferred from the depth of discharge and/or the state of charge of the measuring cell at the start time. This applies for all aspects of the invention and their embodiments. The measuring cell can consequently be used to ascertain the state of charge of the main cell. This can take place while the main cell continues its normal operation.

BRIEF DESCRIPTION OF THE DRAWINGS

Exemplary embodiments of the invention are described hereinunder with reference to the accompanying drawings. In the drawings.

DETAILED DESCRIPTION

Figure 1:
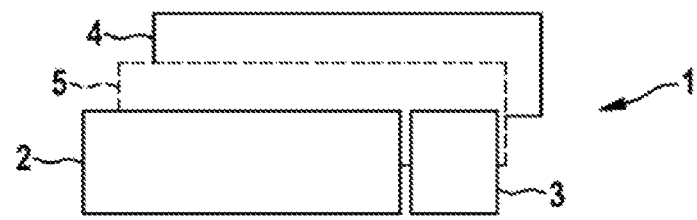
FIG. 1 is a schematic illustration of the construction of an energy storage device in accordance with the invention.

FIG. 1 illustrates schematically the construction of a lithium ion energy storage device 1. This comprises an electrode 2, 3 that is subdivided into a main section 2 and a measuring section 3. The main section 2 and the measuring section 3 are electrically insulated from one another. The energy storage device also comprises a separator 5 and a mating electrode 4, wherein the separator 5 is arranged between the electrode 2, 3 and the mating electrode 4 and prevents electrons from passing between the electrode and the mating electrode. It is preferred that the main section 2, the measuring section 3 and the mating electrode 4 are in each case provided with a separate connector for providing the connection, not illustrated in FIG. 1. The electrode 2, 3 and the mating electrode 4 are in each case essentially planar structures that can be rolled up as one. The main section 2 together with the mating electrode 4 and the section of the separator 5 that lies between the two forms a main cell of the energy storage device. A measuring cell of the energy storage device is formed from the measuring section 3, the mating electrode 4 and the section of the separator 5 that lies between these two elements.

Figure 2A:
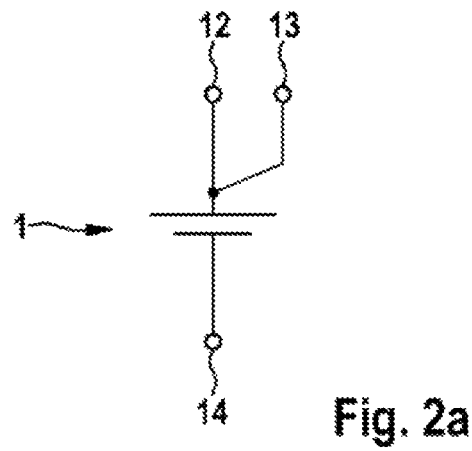
FIG. 2a is a circuit symbol of a first variant of the energy storage device in accordance with the invention.

FIG. 2a illustrates a circuit symbol for the lithium ion energy storage device 1. The energy storage device 1 itself is illustrated as a circuit symbol for a galvanic cell that comprises the connectors 12, 13 and 14. The main section connector 12 is connected to the main section 2 of the electrode 2, 3 and the measuring connector 13 is connected to the measuring section 3 of the electrode 2, 3. The electrode 2, 3 is embodied as a cathode. The mating electrode connector 14 is connected to the mating electrode 4 that is embodied as an anode.

Figure 2B:
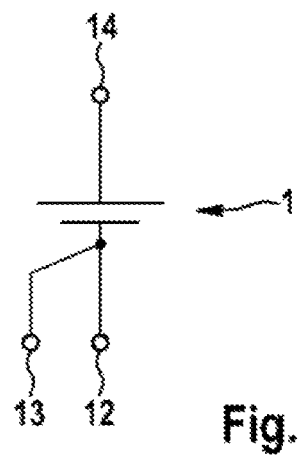
FIG. 2b is a circuit symbol of a second variant of the energy storage device in accordance with the invention.

FIG. 2b illustrates a further variant of the energy storage device 1 as a circuit symbol. In this example, the anode is embodied as a divided electrode 2, 3. The main section 2 is connected in turn to the main section connector 12 and the measuring section 3 is connected to the measuring connector 13. The mating electrode 4 that is embodied as a cathode is connected to the mating electrode connector 14.

FIG. 2b illustrates a further variant of the energy storage device 1 as a circuit symbol. In this example, the anode is embodied as a divided electrode 2, 3. The main section 2 is connected in turn to the main section connector 12 and the measuring section 3 is connected to the measuring connector 13. The mating electrode 4 that is embodied as a cathode is connected to the mating electrode connector 14.

Figure 3:
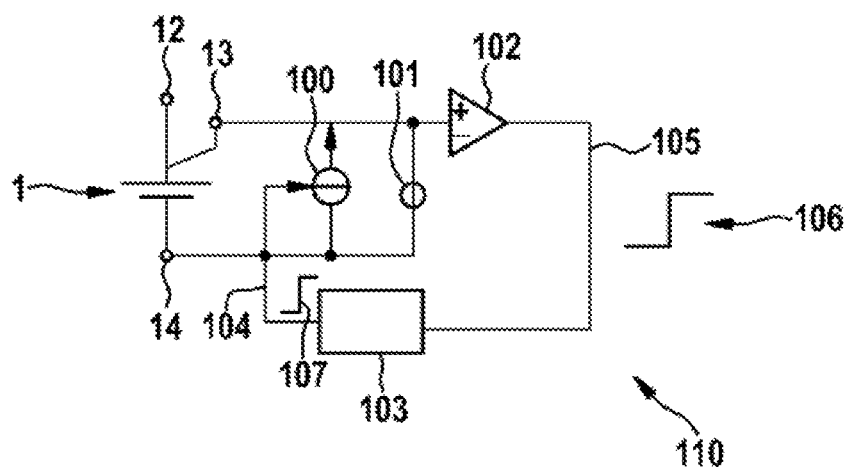
FIG. 3 is a schematic circuit diagram of a circuit arrangement of a first embodiment of the invention.

FIG. 3 illustrates schematically a circuit diagram of a circuit arrangement of a first embodiment of the lithium ion energy storage device 1. The measuring connector 13 of the lithium ion energy storage device 1 is connected to the connector of a current source 100. The mating electrode connector 14 of the energy storage device 1 is connected to a second connector of the current source 100, so that the current source can charge the measuring cell 3, 4 of the energy storage device. The technical flow direction of the current source 100 is illustrated by an arrow in the connecting line to the measuring connector 13. The current source 100 is embodied as a current source 100 that can be switched on and switched off and that accordingly comprises a switch input. The measuring connector 13 is connected to a non-inverting input of a comparator 102. An inverting input of the comparator 102 is connected to a connector of a reference voltage source 101. A further connector of the reference voltage source 101 is connected to the mating electrode 2 and the potential of said mating electrode is used as a reference potential for the reference voltage of the reference voltage source 101. Prior to switching on the current source 100, the voltage between the measuring connector 13 and the mating electrode connector 14 is in the normal case lower than the reference voltage of the reference voltage source 101. If the voltage between the measuring connector 13 and the mating electrode connector 14 increases to above the reference voltage of the reference voltage source 101 as a result of charging the measuring cell 3, 4, then the comparator 102 reacts by outputting a rising edge 106 on the signal line 105 to a microcontroller 103. The microcontroller 103 comprises a time measuring device. This time measuring device is started so as to measure time when the current source is switched on for the charging procedure. For this purpose, the microcontroller 103 outputs a control edge 107 by way of a control line 104 to the switch input of the current source 100 at least at almost the same time as the time measuring procedure commences. As illustrated, said control edge can be a positive edge, however in alternative variants it can also be a negative edge or a pulse or the like. If the edge 106 reaches from the comparator 102 to the microcontroller 103, then said microcontroller terminates the time measuring procedure, as a consequence of which a charging period is measured. It is preferred that as the pulse 106 arrives by way of the control line 105 the current source 100 is switched off by way of the control line 104 by the microcontroller 103. The current source 100 is preferably a constant current source and the current that is output by said current source is not dependent upon the voltage of the measuring cell 3, 4. In this case, the measured charging period corresponds to a magnitude of charge that has flowed into the measuring cell 3, 4. The longer this time period, the greater the depth of discharge or the lower the state of charge of the measuring cell 3, 4.

Figure 4:
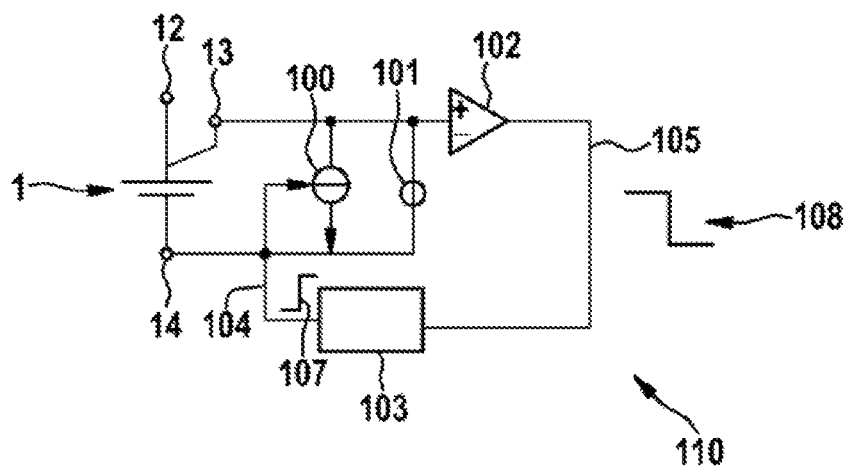
FIG. 4 is a schematic circuit diagram of a circuit arrangement of a second embodiment of the invention.

FIG. 4 illustrates schematically a circuit diagram of a further embodiment of the lithium ion energy storage device 1. This embodiment corresponds to a great extent to the embodiment that is illustrated in FIG. 3. Like components and features are described by like reference numerals. Only the differences between the two embodiments are mentioned hereinunder. The most important difference is that the current source 100 generates a technical flow direction from the measuring connector 13 to the mating electrode connector 14. This is illustrated by an arrow in the supply line to the mating electrode connector 14. The switching on of the current source 100 consequently leads to the measuring cell 3, 4 discharging. The voltage of the measuring cell 3, 4 is generally greater than the reference voltage of the reference voltage source 101 prior to the commencement of the discharging procedure. The reference voltage source 101 consequently delivers a lower reference voltage in comparison to the embodiment in FIG. 3. Accordingly, the comparator outputs a negative edge 108 by way of the signal line 105 to the microcontroller 103. The microcontroller 103 reacts to such a negative edge 108 by terminating the time measuring procedure. The microcontroller 103 measures a discharging period. The discharging period is the longer, the greater the state of charge or the lower the depth of discharge of the measuring cell. It is possible to infer the state of charge or depth of discharge of the main cell from the state of charge or the depth of discharge of the measuring cell, which also applies for the embodiment in FIG. 3.

The invention claimed is:

1. A lithium ion energy storage device comprising:
   an electrode having a main section and a measuring section that is electrically separated from the main section,
   a mating electrode including a mating electrode main section and a mating electrode measuring section that is electrically separated from the mating electrode main section,
   a separator between the electrode and the mating electrode,
   a measuring cell defined by the measuring section of the electrode and the mating electrode measuring section that lies opposite the measuring section of the electrode and is separated from the measuring section of the electrode by the separator,
   a main cell defined by the main section of the electrode and the mating electrode main section that lies opposite the main section of the electrode and is separated from the main section of the electrode by the separator, and
   a measuring device for measuring a depth of discharge, a state of charge, or both a depth of discharge and a state of charge of the measuring cell by charging or discharging the measuring cell without charging or discharging the main cell.

2. The lithium ion energy storage device as claimed in claim 1, wherein the measuring device comprises a current source that is connected between the measuring section and the mating electrode (II), and a voltage ascertaining device (02) that is connected to the measuring section and the mating electrode, and a time measuring device, with which it is possible to measure a charging period a discharging period, or both depth of discharge and a state of charge.

3. The lithium ion energy storage device as claimed in claim 2, wherein the voltage ascertaining device is a comparator and the end time of the time measuring procedure can be defined on the basis of the output signal of said voltage ascertaining device.

4. The lithium ion energy storage device as claimed in claim 3, wherein the measuring device of said lithium ion energy storage device comprises a reference voltage source that is connected to the comparator.

5. The lithium ion energy storage device as claimed in claim 2, wherein the time measuring device operates in a pulsed manner.

6. The lithium ion energy storage device as claimed in claim 2, wherein the current source is designed so as to output a constant current and/or can be switched on and switched off.

7. A method for ascertaining a depth of discharge, a state of charge, or both a depth of discharge and a state of charge of a lithium ion energy storage device, the method comprising
   starting a flow of a charging current or a discharging current into a measuring cell without starting the flow of the charging current into a main cell, the measuring cell defined as a measuring section of an electrode of the lithium ion energy storage device electrically separated from a main section of the electrode and a measuring section of a mating electrode of the lithium ion energy storage device electrically separated from a main section of the mating electrode, the measuring section of the electrode and the measuring section of the mating electrode separated by a separator and the main cell defined as the main section of the electrode and the main section of the mating electrode,
   charging or discharging the measuring cell until a reference voltage is achieved,
   determining a charging period or discharging period of the measuring cell, and
   determining a state of charge, a depth of discharge, or both a state of charge and a depth of discharge of the measuring cell based upon the charging period or discharging period of the measuring cell.

8. The method as claimed in claim 7, wherein in a first step a time measuring procedure is commenced at the start time by means of a time measuring device, and in a second step the time measuring procedure is terminated once a predefined voltage of the measuring cell is achieved.

9. The method as claimed in claim 7, wherein the state of charge or the depth of discharge of the main cell is inferred from the state of charge, the depth of discharge, or both a depth of discharge and a state of charge of the measuring cell at the start time.

* * * * *